(12) United States Patent
Lee et al.

(10) Patent No.: US 11,688,674 B2
(45) Date of Patent: Jun. 27, 2023

(54) PRINTED CIRCUIT BOARD AND ELECTRONIC COMPONENT PACKAGE

(71) Applicant: SAMSUNG ELECTRO-MECHANICS CO., LTD., Suwon-si (KR)

(72) Inventors: Sang Min Lee, Suwon-si (KR); Young Il Cho, Suwon-si (KR); Jong Seok Na, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 155 days.

(21) Appl. No.: 17/196,641

(22) Filed: Mar. 9, 2021

(65) Prior Publication Data

US 2022/0173025 A1 Jun. 2, 2022

(30) Foreign Application Priority Data

Dec. 2, 2020 (KR) .......................... 10-2020-0166989

(51) Int. Cl.
*H01L 23/498* (2006.01)
*H01L 21/48* (2006.01)
*H01L 23/00* (2006.01)

(52) U.S. Cl.
CPC .... *H01L 23/49822* (2013.01); *H01L 21/4857* (2013.01); *H01L 23/49838* (2013.01); *H01L 23/49816* (2013.01); *H01L 23/49866* (2013.01); *H01L 23/49894* (2013.01); *H01L 24/16* (2013.01); *H01L 24/48* (2013.01); *H01L 24/73* (2013.01); *H01L 2224/10175* (2013.01); *H01L 2224/16227* (2013.01); *H01L 2224/48227* (2013.01); *H01L 2224/73257* (2013.01)

(58) Field of Classification Search
CPC ........... H01L 23/49822; H01L 21/4857; H01L 23/49838
See application file for complete search history.

(56) References Cited

U.S. PATENT DOCUMENTS

| 2010/0002406 A1* | 1/2010 | Hsu | H01L 23/49822 361/764 |
| 2011/0100695 A1* | 5/2011 | Lin | H05K 1/111 174/261 |
| 2016/0157353 A1* | 6/2016 | Choi | H05K 1/112 361/764 |
| 2018/0233423 A1* | 8/2018 | Lobianco | H01L 24/13 |

FOREIGN PATENT DOCUMENTS

KR 10-1574019 B1 12/2015

* cited by examiner

*Primary Examiner* — Errol V Fernandes
(74) *Attorney, Agent, or Firm* — Morgan, Lewis & Bockius LLP

(57) ABSTRACT

A printed circuit board includes a first insulating layer; an external connection pad embedded in a first surface of the first insulating layer and having a first externally exposed surface disposed at substantially the same level as the first surface of the first insulating layer; a second insulating layer disposed on a second surface of the first insulating layer and having a first surface in contact with the second surface of the first insulating layer; and a first wiring pattern embedded in the second insulating layer and exposed from the first surface of the second insulating layer to be in contact with a second externally exposed surface of the external connection pad opposing the first externally exposed surface.

23 Claims, 5 Drawing Sheets

PRINTED CIRCUIT BOARD AND ELECTRONIC COMPONENT PACKAGE

CROSS-REFERENCE TO RELATED APPLICATION(S)

The present application claims the benefit of priority to Korean Patent Application No. 10-2020-0166989, filed on Dec. 2, 2020 in the Korean Intellectual Property Office, the entire disclosure of which is incorporated herein by reference for all purposes.

TECHNICAL FIELD

The present disclosure relates to a printed circuit board and an electronic component package.

BACKGROUND

As a pitch of nodes of a semiconductor chip is reduced, a pitch of a connection pad formed on a printed circuit board connected to the semiconductor chip is also becoming finer. In addition, a printed circuit board for application to small electronic products, such as mobiles, or the like, is packaged by mounting semiconductor chips including a one-chip and a stack chip, due to a limitation of thicknesses of electronic products.

An embedded trace substrate (ETS) method is used as a method of manufacturing a printed circuit board to manufacture a thin printed circuit board having a connection pad having a fine pitch gap, and printed circuit boards manufactured by this method have been commercialized.

Bondability of a chip connected to a wire bonding pad is not excellent, as the wire bonding pad of the printed circuit board manufactured by the ETS method and an insulating layer in which the wire bonding pad is embedded may not be flat.

In such a situation in which thicknesses of electronic products are limited, there is a need to provide technology for increasing the number of wire bonding pads per unit area by minimizing pitches of the wire bonding pads connected to extremely fine chip nodes.

SUMMARY

An aspect of the present disclosure is to provide a printed circuit board including an external connection pad and an insulating layer, formed to be flat, in which the external connection pad is embedded.

An aspect of the present disclosure is to provide a printed circuit board in which only an external connection pad is formed in a single insulating layer without other wiring patterns and a wiring pattern connected to the external connection pad is formed as another insulating layer so as to include the external connection pad formed to have a fine pitch in the single insulating layer.

An aspect of the present disclosure is to provide an electronic component package including a printed circuit board in which an external connection pad is formed in a single insulating layer to have a fine pitch without other wiring patterns.

According to an aspect of the present disclosure, a printed circuit board includes a first insulating layer; an external connection pad embedded in a first surface of the first insulating layer and having a first externally exposed surface disposed at substantially the same level as the first surface of the first insulating layer; a second insulating layer disposed on a second surface of the first insulating layer and having a first surface in contact with the second surface of the first insulating layer; and a first wiring pattern embedded in the second insulating layer and exposed from the first surface of the second insulating layer to be in contact with a second externally exposed surface of the external connection pad opposing the first externally exposed surface.

Further, according to another aspect of the present disclosure, a printed circuit board includes a first insulating layer; a first external connection pad and a second external connection pad embedded in the first insulating layer, the second external connection pad being spaced apart from the first external connection pad; and a second insulating layer comprising a first wiring pattern connected to each of the first external connection pad and the second connection external pad, wherein first surfaces of the first and second external connection pads are exposed to a first surface of the first insulating layer and substantially coplanar with the first surface of the first insulating layer, and the first insulating layer and the second insulating layer are different layers from each other.

Further, according to still another aspect of the present disclosure, an electronic component package includes a printed circuit board comprising a first insulating layer, in which an external connection pad is embedded, and having a thickness substantially the same as a thickness of the external connection pad, and a second insulating layer in contact with the first insulating layer and comprising a first wiring pattern connected to the external connection pad; a semiconductor chip connected to the external connection pad; and an encapsulation layer encapsulating the semiconductor chip.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
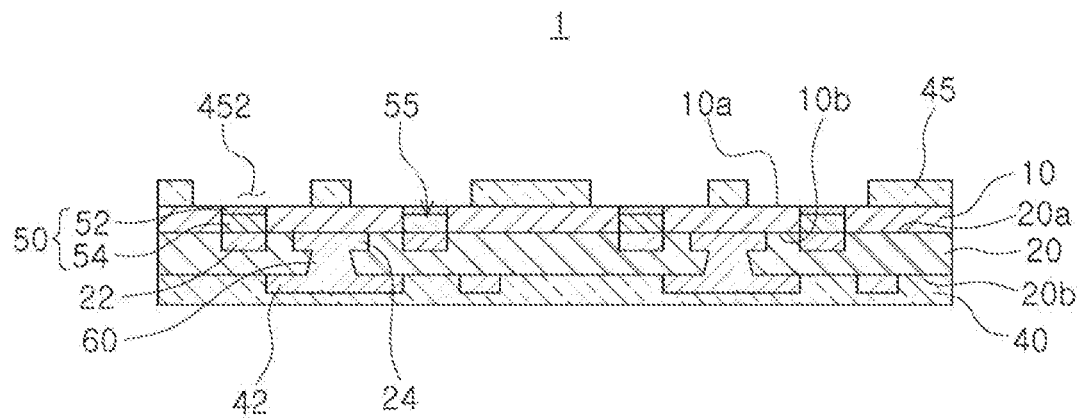
FIG. 1 is a schematic diagram illustrating a cross-section of a printed circuit board according to an example embodiment of the present disclosure.

Preferred example embodiments of the present disclosure will be described with reference to the accompanying drawings.

The example embodiments are subject to various modifications and are provided to assist those skilled in the art in gaining a completely comprehensive understanding. Accordingly, shapes and sizes of elements in the drawings may be exaggerated for clarity, and elements indicated by the same reference numerals in the drawings refer to the same elements.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first" and "second" maybe used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for simply describing various examples only, and is not to be used to limit the disclosure. In this case, expressions in the singular include plural expressions unless otherwise indicated.

Printed Circuit Board

FIG. 1 is a schematic diagram illustrating a cross-section of a printed circuit board according to an example embodiment of the present disclosure.

Referring to FIG. 1, a printed circuit board 1 includes a first insulating layer 10, external connection pads 50 and 55, a second insulating layer 20 and a first wiring pattern 22.

The external connection pads 50 and 55 are embedded in the first insulating layer 10, and the first insulating layer 10 and the external connection pads 50 have substantially the same thickness. The external connection pads include a plurality of external connection pads including a first external connection pad 50 and a second external connection pad 55, and a distance between the first and second external connection pads may form a fine pitch. Meanwhile, the fact that the first insulating layer 10 and the external connection pads 50 have substantially the same thickness means that first surfaces 10a of the first and second external connection pads 50 and 55 and a first surface 10a of the first insulating layer are disposed at the same level and formed to be flat, thereby having the same thickness. The expression "substantially the same" means being the same in terms of process errors, positional deviations, and measurement errors occurring in manufacturing process.

Thicknesses of the external connection pads 50 and 55 are substantially the same as that of the first insulating layer 10, and the external connection pads 50 and 55 are exposed from the first surface 10a and a second surface 10b of the first insulating layer opposing the first surface 10a. In a semiconductor chip package, the external connection pads 50 and 55 exposed from the first surface 10a of the first insulating layer 10 may be a wire bonding pad in which a semiconductor chip is wire-bonded, or a connection pad in which a semiconductor chip is flip chip-bonded to be mounted. The fact that the thicknesses are substantially the same means that the thicknesses are the same in terms of process errors, positional deviations, and measurement errors occurring in manufacturing process.

The second insulating layer 20 is disposed on the second surface 10b of the first insulating layer 10, and a first surface 20a of the second insulating layer 20 is in contact with the second surface 10b of the first insulating layer 10. The first and second insulating layers 10 and 20 are different layers and can be distinguished from each other.

The second insulating layer 20 includes a first wiring pattern 22 embedded therein. The first wiring pattern 22 is exposed from the first surface 20a of the second insulating layer 20 to be in contact with an opposite surface of an externally exposed surface of the external connection pad 50. Further, a second wiring pattern 24 spaced apart from the first wiring pattern 22 is embedded in the second insulating layer 20. Herein, the second wiring pattern 24 is not in direct contact with the external connection pad 50 to be connected thereto, in contrast to the first wiring pattern 22. The second wiring pattern 24 may be connected to a third wiring pattern 42 embedded in a third insulating layer 40, disposed on a second surface 20b of the second insulating layer 20 opposing the first surface 20a thereof, by a via 60.

The second insulating layer 20 and the third insulating layer 40 are repeatedly built up to form a multilayer circuit board, and the number of layers thereof can be determined as needed. Further, the third wiring pattern 42 of the third insulating layer 40 may be an outermost wiring pattern as in the present example embodiment.

The external connection pads 50 and 55 are exposed to an outside and are configured to have a structure in which a first metal layer 52 and a second metal layer 54 are stacked in order from outside in a thickness direction of the first and second insulating layers 10 and 20.

The first metal layer 52 may include any one of a gold (Au) layer, a silver (Ag) layer or a nickel (Ni) layer. The first metal layer 52 is a metal pad electrically connected to a semiconductor chip when forming a package and may be a metal layer formed by plating with Au so as to be advantageous in wire bonding.

The second metal layer 54 may include any one of a gold (Au) layer, a silver (Ag) layer or a nickel (Ni) layer. The second metal layer 43 is not particularly limited as long as it is a metal layer which can be electrically connected to the first wiring pattern 22 of the second insulating layer 20, and may be a metal layer formed by plating with Ni. Alternately, the second metal layer maybe formed as a multilayer structure in which an Ag-layer and a Ni-layer are stacked.

Since the first metal layer 52 is formed to have a depth allowing wire bonding, the second metal layer 54 is thicker than the first metal layer 52.

The external connection pad 50 including the first metal layer 52 and the second metal layer 54 has a thickness substantially the same as a thickness of the first insulating layer 10, and the first metal layer 52 is formed to be substantially coplanar with the first insulating layer. As such, reliability of wire bonding can be improved. The fact that the thicknesses are substantially the same means that the thicknesses are the same in terms of process errors, positional deviations, and measurement errors occurring in manufacturing process.

The printed circuit board 1 according to the present example embodiment may further include a solder resist layer 45 on the first insulating layer 10 to protect the external connection pad 50. The solder resist layer 45 may be laminated by a screen printing method using photosensitive solder resist (PSR) ink. An area and a size of the solder resist application are determined in relation to pattern shape and size of the designed external connection pad 50, and the solder resist layer 45 includes an opening 452 exposing the external connection pad 50. When the opening 452 is formed with a laser, a non-photosensitive thermosetting resin is used for the solder resist layer 45.

Further, the first insulating layer 10 may include a thermosetting insulating resin or a photosensitive insulating resin. The first insulating layer 10 may include photosensitive solder resist ink that is the same material as the solder resist layer 45 and protects the external connection pad 50 embedded in the first insulating layer 10.

The second insulating layer 20 may include a glass-containing insulating material or a glass-free inorganic insulating layer.

FIGS. 2A to 2I are cross-sectional views illustrating a method of manufacturing the printed circuit board of FIG. 1.

FIGS. 2A to 2I are diagrams of an embodiment illustrating a method for manufacturing a printed circuit board according to an example embodiment. Each process is performed in a different order unless a specific order is clearly stated in context.

Figure 2A:
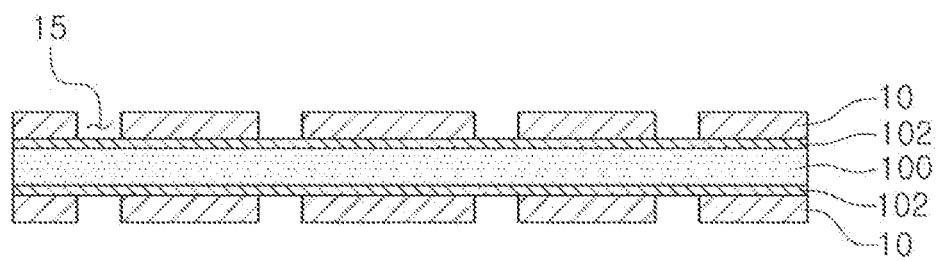
FIGS. 2A to 2I are cross-sectional views illustrating a method of manufacturing the printed circuit board of FIG. 1.

In FIG. 2A, an insulating core 100 in which a base copper layer 102 is stacked on at least one surface is provided. In the present example embodiment, the insulating core 100 may be a carrier board in which the base copper layers 102 are stacked on both sides. The first insulating layer 10 is then stacked on the base copper layer 102. In the first insulating layer 10, a contact hole 15 is formed according to a designed circuit pattern, and the base copper layer 102 is selectively exposed. The base copper layer 102 becomes a plating seed layer for forming an external connection pad.

The first insulating layer 10 may include a thermosetting insulating resin or a photosensitive insulating resin. A photosensitive solder resist ink may be used as the photosensitive insulating resin, and a contact hole 15 of the first insulating layer may be formed at fine pitch intervals by performing photolithography on the first insulating layer 10.

Figure 2B:
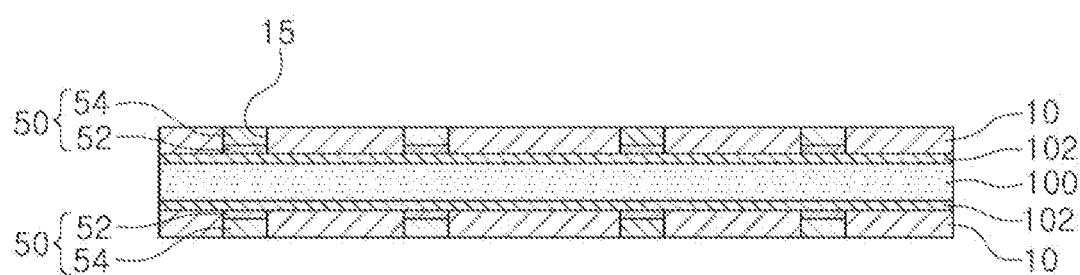

Referring to FIG. 2B, a process of forming a metal layer 50 by filling the contact hole by plating on the base copper layer 102 exposed through the finely patterned contact hole 15 is performed. The plating is performed by electroplating, chemical plating or sputtering, and the metal layer 50 eventually becomes an external connection pad such as a wire bonding pad or a flip chip connection pad.

The metal layer 50 includes a first metal layer 52 formed by first plating on the base copper layer 102 and a second metal layer 54 formed by plating again after the first metal layer 52 is formed.

The first metal layer 52 may be formed by plating with any one of a gold (Au) layer, a silver (Ag) layer or a nickel layer (Ni) layer. The first metal layer 52 is a metal pad electrically connected to a semiconductor chip when a package is formed, and may be a metal layer formed by plating with Au so as to be advantageous in wire bonding.

The second metal layer 54 may also include any one of a gold (Au) layer, a silver (Ag) layer or a nickel layer (Ni) layer. The second metal layer 54 may be a metal layer formed by plating with nickel (Ni). Alternately, the second metal layer may be formed as a multilayer in which an Ag-layer and a Ni-layer are stacked.

Since the first metal layer 52 is formed to be thin enough to allow wire bonding, the second metal layer 54 is thicker than the first metal layer 52.

Figure 2C:
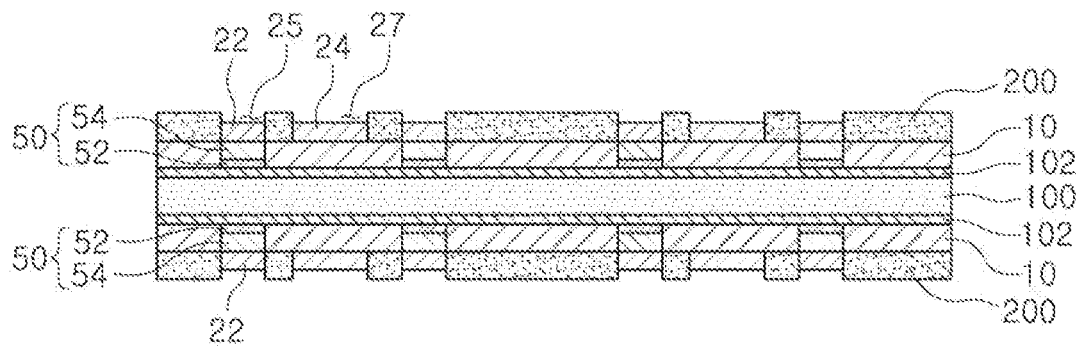
Figure 2D:
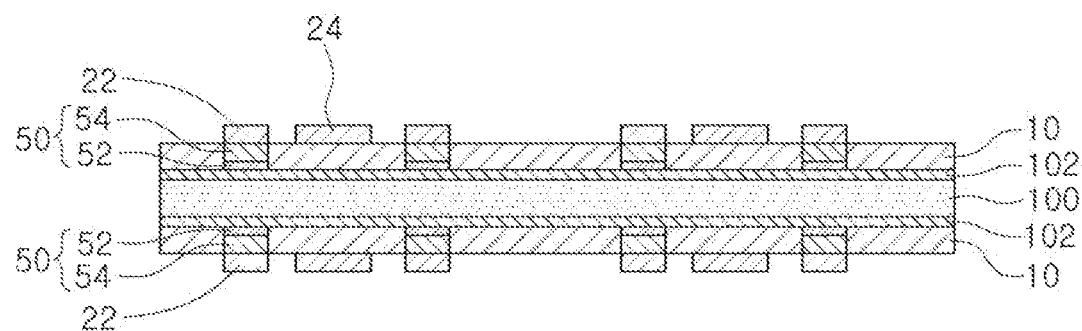

Referring to FIGS. 2C and 2D, a process of stacking a wiring pattern on the first insulating layer 10 is performed.

First, in FIG. 2C, a resist pattern layer 200 including a contact hole 25 exposing a metal layer 50 and a wiring pattern hole 27 forming a wiring pattern is stacked on the first insulating layer 10. A base copper layer (not illustrated) for wiring pattern plating is formed on a lower surface of the resist pattern layer 200. A contact hole 25 and the wiring pattern hole 27 of the resist pattern layer 200 may be plated through the base copper layer to form wiring patterns 22 and 24. As a method of forming the contact hole 25 and the wiring pattern hole 27, photolithography, laser drilling, or the like, may be performed. The plating for forming the wiring patterns 22 and 24 is performed by electroplating, chemical plating or sputtering, and copper (Cu) may be used.

A first wiring pattern 22 is formed through the contact hole 25, and a second wiring pattern 24 spaced apart from the first wiring pattern 22 is formed through the wiring pattern hole 27.

Referring to FIG. 2D, the resist pattern layer 200 is removed after the first wiring pattern 22 and the second wiring pattern 24 are formed. The base copper layer (not illustrated) is also removed through etching or physical polishing according to a predesigned circuit pattern.

Figure 2E:
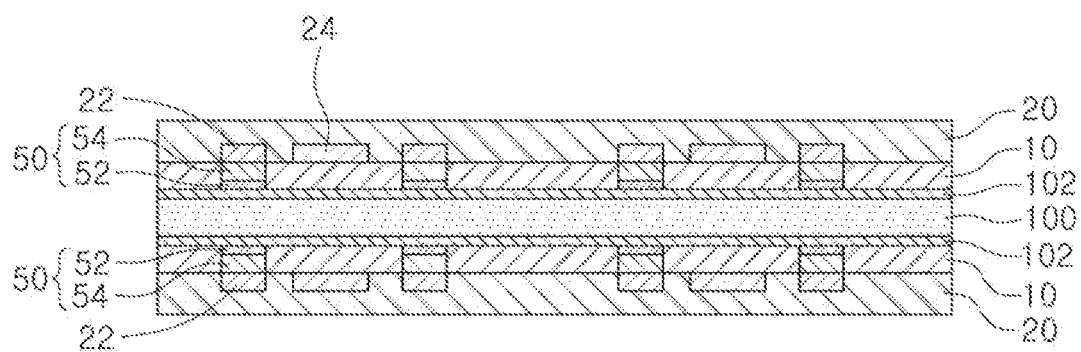

Referring to FIG. 2E, a process of forming the second insulating layer 20 on the first insulating layer 10 begins. The first insulating layer 10 and the second insulating layer are different layers and may be distinguished from each other.

A first wiring pattern 22 and a second wiring pattern 24 spaced apart from the first wiring pattern are embedded in the second insulating layer 20. The second insulating layer 20 may include a glass-containing insulating material or a glass-free inorganic insulating resin. Prepreg (PPG) may be used as the glass-containing insulating material, and an ABF film may be used as the glass-free inorganic insulating resin. The insulating material is not specifically limited.

Figure 2F:
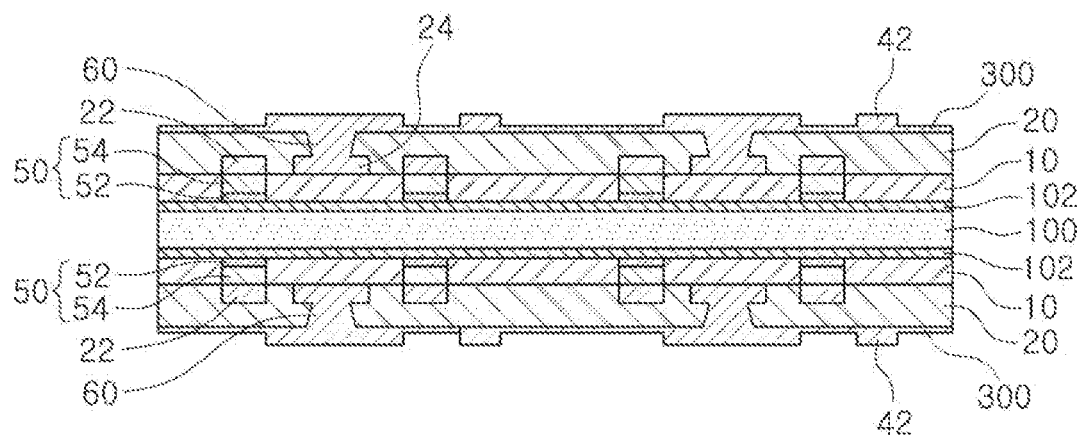

Referring to FIG. 2F, a via 60 is processed on the second insulating layer 20, and the via 60 is subject to a process of connecting a third wiring pattern 42 formed on the other surface of the second insulating layer 20 by plating to the second wiring pattern 24, an inner layer pattern.

As illustrated in FIG. 2C, the third wiring pattern 42 is formed by stacking a resist pattern layer (not illustrated) and plating the base copper layer 300 formed on the lower surface as a seed layer. After the third wiring pattern 42 is formed, the resist pattern layer is removed by etching, or the like. The base copper layer 300 is then also removed according to the designed circuit pattern.

As the above, it is possible to stack a desired number of layers for the printed circuit board by repeating the processes of stacking the insulating layers, processing the via, and connecting inner layer patterns and outer layer patterns. In the present example embodiment, the third wiring pattern 42 is an outermost layer wiring pattern.

Figure 2G:
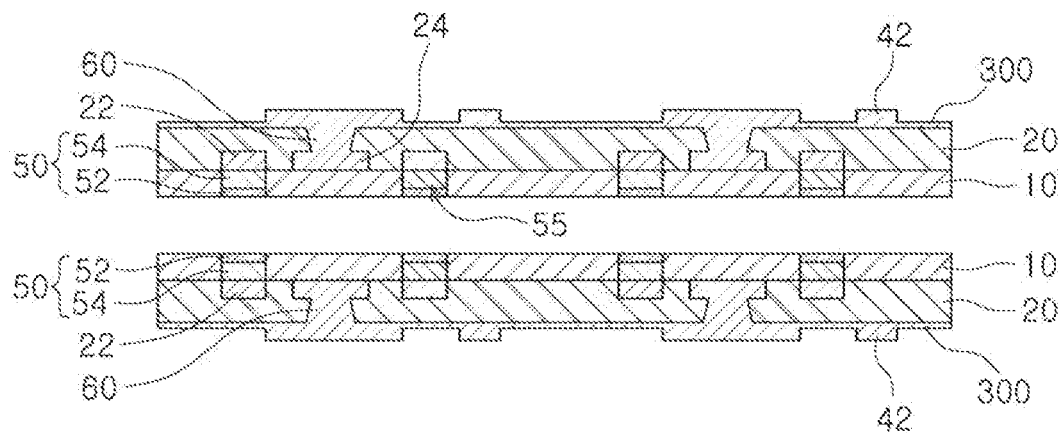
Figure 2H:
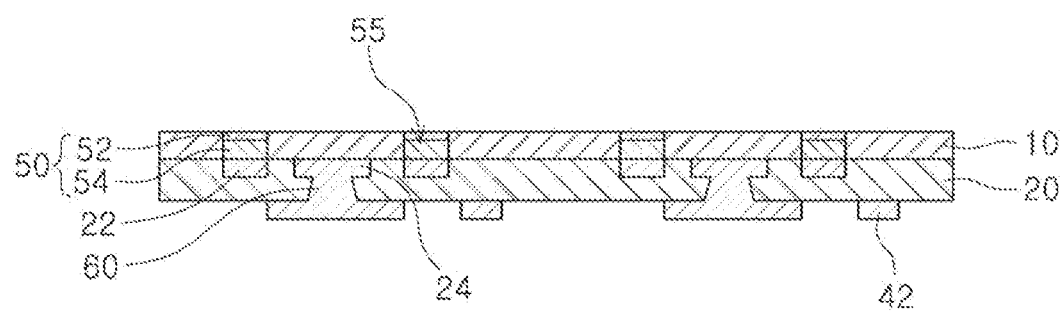

Referring to FIGS. 2G and 2H, the insulating core 100 is removed to separate a unit board structure formed on a first surface and a second surface of the insulating core 100. By separating the unit board structure, the first external connection pad 50 and the second external connection pad 55 embedded in the first insulating layer 10 at fine intervals are exposed to the outside.

Figure 2I:
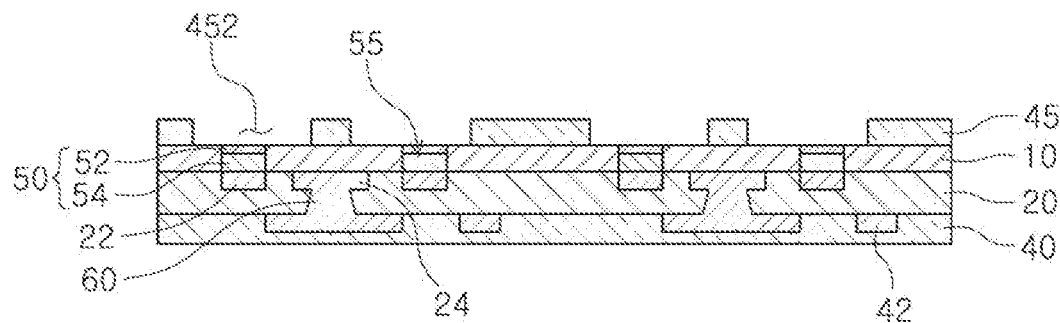

Referring to FIG. 2I, the solder resist layer 45 selectively exposing the external connection pads including the first external connection pad 50 and the second external connection pad 55 is stacked. In addition, the solder resist layer 40 is stacked on the second insulating layer 20 as well to protect the third wiring pattern 42.

The solder resist layers 40 and 45 may be stacked using a photosensitive solder resist (PSR) ink to protect the external connection pad 50 by a screen-printing method. An area and a size of the solder resist application are determined in relation to pattern shape and size of the designed external connection pad 50. The solder resist layer 45 may have an opening 452 exposing the external connection pad 50. When the opening 452 is formed by a laser, a non-photosensitive thermosetting resin is used.

Referring to FIG. 1 together with FIGS. 2A to 2I again, the printed circuit board 1 according to an example embodiment of the present disclosure include the first insulating layer 10 and the second insulating layer 20.

A first external connection pad 50 and a second external connection pad 55, spaced apart from or disposed at a fine pitch distance from each other, are embedded in the first insulating layer 10.

The second insulating layer 20 includes a first wiring pattern 22 connected to each of the first external connection pad 50 and the second external connection pad 55.

In addition, in the printed circuit board 1 of the present example embodiment, the first surfaces 10a of the first and second external connection pads 50 and 55 are exposed to the first surface 10a of the first insulating layer 10, and are substantially coplanar with the first surface 10a of the first insulating layer 10. The first insulating layer 10 and the second insulating layer 20 form different layers distinguished from each other.

The thicknesses of the first external connection pad 50 and the second external connection pad 55 are substantially the same as that of the first insulating layer 10, and the first metal layer 52 including gold (Au) and a second metal layer 54 including nickel (Ni) are stacked from the outside. The second metal layer 54 is thicker than the first metal layer 52. The meaning of the expression "substantially the same" has been defined in the other embodiments, and thus, repeated descriptions will be omitted.

The second insulating layer 20 includes the second wiring pattern 24 spaced apart from the first wiring pattern 22 on the same layer, and the second wiring pattern 24 is connected to the third wiring pattern 42 formed on the second insulating layer 20 through the via 60, where the third wiring pattern 42 may be an outermost layer wiring pattern.

The printed circuit board 1 of the present example embodiment further includes the solder resist layer 45, and the solder resist layer 45 is disposed on the first insulating layer 10 and protects the first external connection pad 50 and the second external connection pad 55.

In addition, the solder resist layer 45 is formed with an opening 452 exposing the first external connection pad 50 and the second external connection pad 55 so as to be disposed between the first external connection pad 50 and the second external connection pad 55 as well.

Meanwhile, the first insulating layer 10 may include a thermosetting insulating resin or a photosensitive insulating resin, and the second insulating layer 20 may include a glass-containing insulating material or a glass-free inorganic insulating resin.

Electronic Component Package

Figure 3:
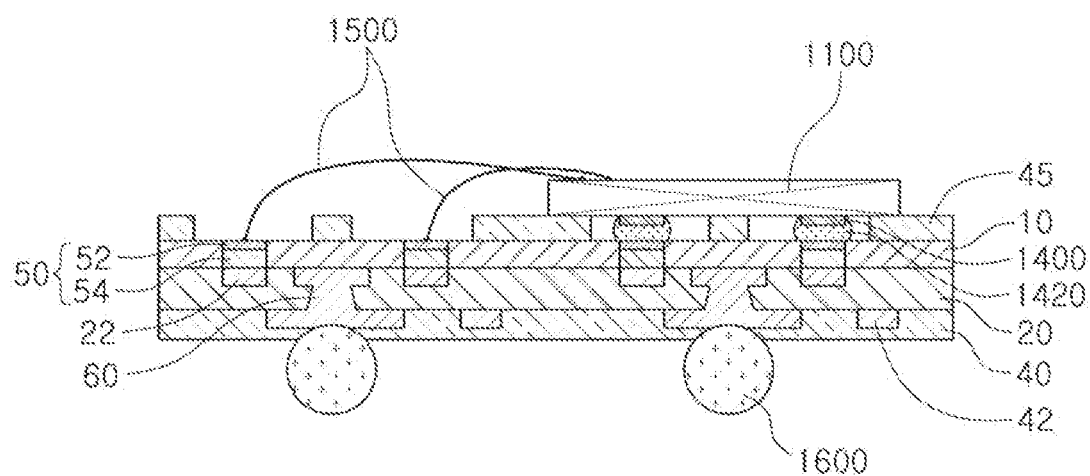
FIGS. 3 and 4 are schematic diagrams illustrating an electronic component package formed by combining a semiconductor chip and a printed circuit board according to an example embodiment.
Figure 4:
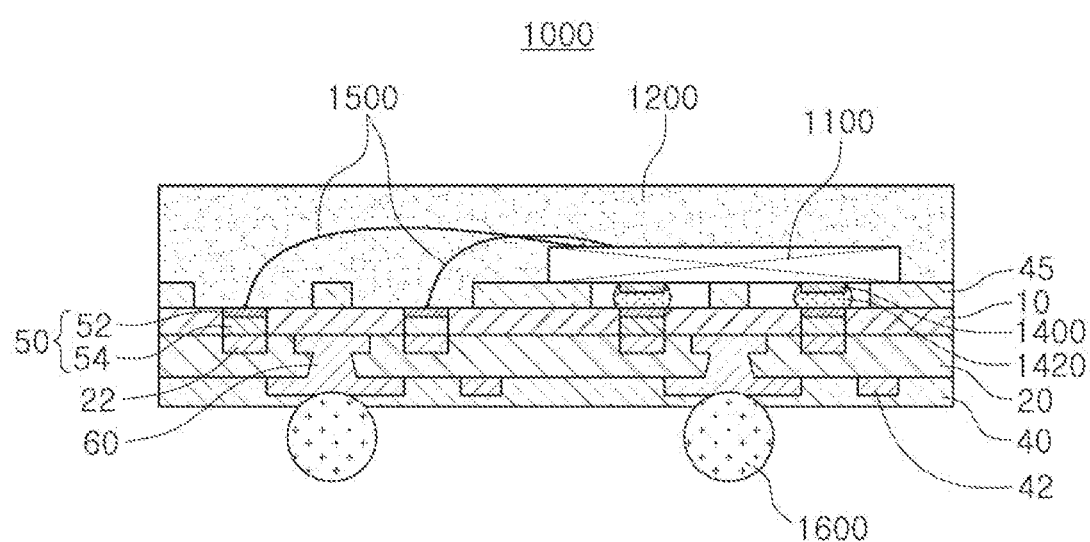

FIGS. 3 and 4 are is schematic diagram illustrating an electronic component package formed by combining a semiconductor chip and a printed circuit board according to an example embodiment.

Referring to FIGS. 3 and 4, an electronic component package 1000 according to an example embodiment of the present disclosure includes the above-described printed circuit board, a semiconductor chip 1100 and an encapsulation layer 1200.

The printed circuit board may include a first insulating layer 10 in which an external connection pad 50 is embedded and having substantially the same thickness with the external connection pad 50 and a second insulating layer in contact with the first insulating layer 10 and including a first wiring pattern 22 connected to the external connection pad 50. The fact that the thicknesses are substantially the same means that the thicknesses are the same in terms of process errors, positional deviations, and measurement errors occurring in manufacturing process.

The semiconductor chip 1100 may be connected to the external connection pad 50 of the printed circuit board to exchange electrical signals with the printed circuit board. The external connection pad 50 may be connected to the semiconductor chip 1100 by at least one of wire bonding, such as using wires 1500, or flip chip bonding. In the case of flip chip bonding, a connection terminal 1400 of the semiconductor chip 1000 is connected to the external connection pad 50 of the printed circuit board via a solder bump 1420.

The encapsulation layer 1200 illustrated in FIG. 4 molds the semiconductor chip 1100 to protect an electronic component from an external environment. In addition, a connection structure, such as a solder ball 1600, may be provided on the third wiring pattern 42, an outermost wiring pattern.

As set forth above, according to the printed circuit board of the present disclosure, the external connection pad forming a fine pitch interval and embedded in one insulating layer may be formed to be flat with the insulating layer.

According to the printed circuit board of the present disclosure, only the external connection pad is embedded in one insulating layer without other wiring patterns, such that an ultra-fine pitch between adjacent external connection pads can achieved, and the number of the wire bonding pads per unit area can be increased.

According to the electronic component package including the printed circuit board of the present disclosure, a distance between the external connection pads forms an ultra-fine pitch and the external connection pads are flat with the insulating layer, thereby improving design freedom and integration of semiconductor chip nodes as well as securing reliability of the wire bonding.

While example embodiments have been shown and described above, it will be apparent to those skilled in the art that modifications and variations could be made without departing from the scope of the present invention as defined by the appended claims.

What is claimed is:
1. A printed circuit board, comprising:
a first insulating layer;
an external connection pad embedded in a first surface of the first insulating layer and having a first externally exposed surface disposed at substantially the same level as the first surface of the first insulating layer;
a second insulating layer disposed on a second surface of the first insulating layer and having a first surface in contact with the second surface of the first insulating layer; and
a first wiring pattern embedded in the second insulating layer and exposed from the first surface of the second insulating layer to be in direct contact with a second externally exposed surface of the external connection pad opposing the first externally exposed surface.

2. The printed circuit board of claim 1, further comprising a second wiring pattern embedded in the second insulating layer and spaced apart from the first wiring pattern,
wherein the second wiring pattern is connected to a third wiring pattern, disposed on the second insulating layer, by a via.

3. The printed circuit board of claim 2, wherein the third wiring pattern is an outermost wiring pattern.

4. The printed circuit board of claim 1, wherein the external connection pad is externally exposed, and includes a first metal layer comprising gold (Au) and a second metal layer comprising nickel (Ni) stacked in a thickness direction of the first insulating layer, and wherein the second metal layer is thicker than the first metal layer.

5. The printed circuit board of claim 1, further comprising a solder resist layer disposed on the first insulating layer to protect the external connection pad.

6. The printed circuit board of claim 5, wherein the solder resist layer includes an opening exposing the external connection pad.

7. The printed circuit board of claim 1, wherein the first insulating layer comprises a thermosetting insulating resin or a photosensitive insulating resin.

8. The printed circuit board of claim 1, wherein the second insulating layer comprises a glass-containing insulating material or a glass-free inorganic insulating layer.

9. The printed circuit board of claim 1, wherein a width of the external connection pad is substantially constant from the first surface of the first insulating layer to the second surface of the first insulating layer.

10. A printed circuit board, comprising:
a first insulating layer;
a first external connection pad and a second external connection pad embedded in the first insulating layer, the second external connection pad being spaced apart from the first external connection pad; and
a second insulating layer comprising a first wiring pattern connected to each of the first external connection pad and the second external connection pad,
wherein first surfaces of the first and second external connection pads are exposed to a first surface of the first insulating layer and substantially coplanar with the first surface of the first insulating layer,
the first insulating layer and the second insulating layer are different layers from each other, and
at least one of the first and second external connection pads includes a plurality of metal layers having a different metal from each other.

11. The printed circuit board of claim 10, wherein thicknesses of the first and second external connection pads are substantially the same as a thickness of the first insulating layer,
each of the first and second external connection pads includes a first metal layer comprising gold (Au) and a second metal layer comprising nickel (Ni) stacked in a thickness direction of the first insulating layer, and
the second metal layer is thicker than the first metal layer.

12. The printed circuit board of claim 10, wherein the second insulating layer comprises a second wiring pattern spaced apart from the first wiring pattern in a same layer, and
wherein the second wiring pattern is connected to a third wiring pattern by a via.

13. The printed circuit board of claim 12, wherein the third wiring pattern is an outermost wiring pattern.

14. The printed circuit board of claim 13, further comprising a solder resist layer disposed on the first insulating layer to protect the first external connection pad and the second external connection pad.

15. The printed circuit board of claim 14, wherein the solder resist layer is disposed on a portion of the first insulating layer located between the first external connection pad and the second external connection pad.

16. The printed circuit board of claim 10, wherein the first insulating layer comprises a thermosetting insulating resin or a photosensitive insulating resin.

17. The printed circuit board of claim 10, wherein the second insulating layer comprises a glass-containing insulating material or a glass-free inorganic insulating layer.

18. An electronic component package, comprising:
a printed circuit board comprising a first insulating layer, in which an external connection pad is embedded, having a thickness substantially the same as a thickness of the external connection pad, and a second insulating layer having a first surface in contact with the first insulating layer and comprising a first wiring pattern connected to the external connection pad; and
a semiconductor chip connected to the external connection pad,
wherein the external connection pad includes a metal different from a metal of the first wiring pattern.

19. The electronic component package of claim 18, wherein the external connection pad is connected to the semiconductor chip by at least one of a wire or a combination of a connection terminal and a solder bump.

20. The electronic component package of claim 18, further comprising a second wiring pattern embedded in the second insulating layer and spaced apart from the first wiring pattern,
wherein the second wiring pattern is connected to a third wiring pattern, disposed on the second insulating layer, by a via.

21. The electronic component package of claim 20, further comprising:
a third insulating layer disposed on the second insulating layer, covering the third wiring pattern, and having an opening to expose a portion of the third wiring pattern; and
a connection structure disposed in the opening of the third insulating layer and connected to the third wiring pattern.

22. The electronic component package of claim 18, wherein a surface of the first wiring pattern, opposing a portion of the first wiring pattern connected to the external connection pad, is spaced apart from a second surface of the second insulating layer, opposing the first surface of the second insulating layer.

23. The electronic component package of claim 18, further comprising an encapsulation layer encapsulating the semiconductor chip.

* * * * *